(12) United States Patent
Dupuy et al.

(10) Patent No.: US 10,030,309 B2
(45) Date of Patent: Jul. 24, 2018

(54) MACHINE TO CHEMICALLY ENGRAVE A PLATE OF STAINLESS STEEL

(75) Inventors: Franck Dupuy, Lauraguel (FR); Joël Harmand, Quillan (FR); Inocencio Marcos, Esperaza (FR); François Lapeyre, La Force (FR)

(73) Assignee: THE DILLER CORPORATION, Cincinnati, OH (US)

( * ) Notice: Subject to any disclaimer, the term of this patent is extended or adjusted under 35 U.S.C. 154(b) by 0 days.

(21) Appl. No.: 14/377,820

(22) PCT Filed: Feb. 10, 2012

(86) PCT No.: PCT/IB2012/000361
§ 371 (c)(1),
(2), (4) Date: Aug. 8, 2014

(87) PCT Pub. No.: WO2013/117951
PCT Pub. Date: Aug. 15, 2013

(65) Prior Publication Data
US 2015/0053646 A1 Feb. 26, 2015

(51) Int. Cl.
*C23F 1/28* (2006.01)
*C23F 1/02* (2006.01)
*C23F 1/08* (2006.01)
*H05K 3/00* (2006.01)
*H05K 3/06* (2006.01)

(52) U.S. Cl.
CPC .................. *C23F 1/28* (2013.01); *C23F 1/02* (2013.01); *C23F 1/08* (2013.01); *H05K 3/0085* (2013.01); *H05K 3/068* (2013.01); *H05K 2203/0108* (2013.01); *H05K 2203/1518* (2013.01); *H05K 2203/1572* (2013.01)

(58) Field of Classification Search
USPC .............................. 156/345.21, 345.11, 345.1
See application file for complete search history.

(56) References Cited

U.S. PATENT DOCUMENTS

| | | |
|---|---|---|
| 2,762,149 A | 9/1956 | Mears |
| 2,822,635 A | 2/1958 | Mears |
| 2,969,300 A * | 1/1961 | Franz .................... H05K 3/041 156/233 |
| 3,415,699 A | 12/1968 | Brown |
| 3,795,561 A | 3/1974 | Bond et al. |
| 4,620,894 A | 11/1986 | Gurian et al. |

(Continued)

FOREIGN PATENT DOCUMENTS

| | | |
|---|---|---|
| DE | 3521135 A1 | 12/1986 |
| GB | 1475386 | 6/1977 |

*Primary Examiner* — Sylvia MacArthur
(74) *Attorney, Agent, or Firm* — Seed IP Law Group LLP

(57) ABSTRACT

A chemical engraving machine to engrave a plate of stainless steel moved along an horizontal direction, said machine comprising a base, an acid liquid circuit adapted to chemically attack said plate of stainless steel at locations where it is not protected by a protection mask, a lower guiding device, an upper guiding device, the lower and upper guiding devices being configured to maintain said plate of stainless steel substantially vertically, and a nozzle support bearing a plurality of spraying nozzles projecting horizontally the acid liquid toward the plate of stainless steel. A method chemically engraves a plate of stainless steel in a vertical position.

10 Claims, 2 Drawing Sheets

(56) References Cited

U.S. PATENT DOCUMENTS

| | | | | |
|---|---|---|---|---|
| 5,863,620 | A * | 1/1999 | Schafer | G03F 7/16 |
| | | | | 118/202 |
| 6,378,199 | B1 * | 4/2002 | Yoshinuma | H05K 3/205 |
| | | | | 174/261 |
| 6,726,848 | B2 * | 4/2004 | Hansen | B08B 3/12 |
| | | | | 134/186 |
| 7,029,597 | B2 * | 4/2006 | Marczak | C23G 1/22 |
| | | | | 205/214 |
| 7,823,595 | B2 * | 11/2010 | Takechi | 134/94.1 |
| 2005/0006205 | A1 * | 1/2005 | Kuo | H05K 3/0085 |
| | | | | 198/624 |
| 2005/0161157 | A1 * | 7/2005 | Muramatsu et al. | 156/345.21 |
| 2009/0020503 | A1 * | 1/2009 | Kim et al. | 216/23 |
| 2009/0039054 | A1 * | 2/2009 | Choi et al. | 216/24 |
| 2010/0006542 | A1 | 1/2010 | Reichert | |

\* cited by examiner

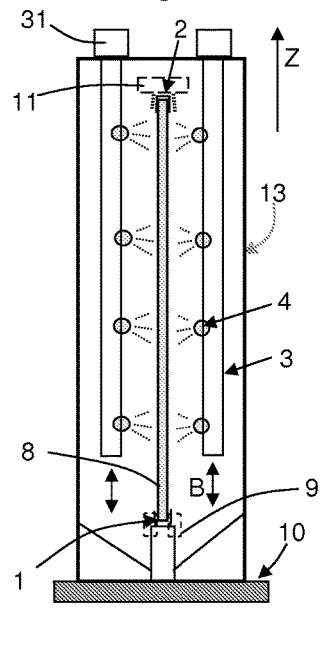
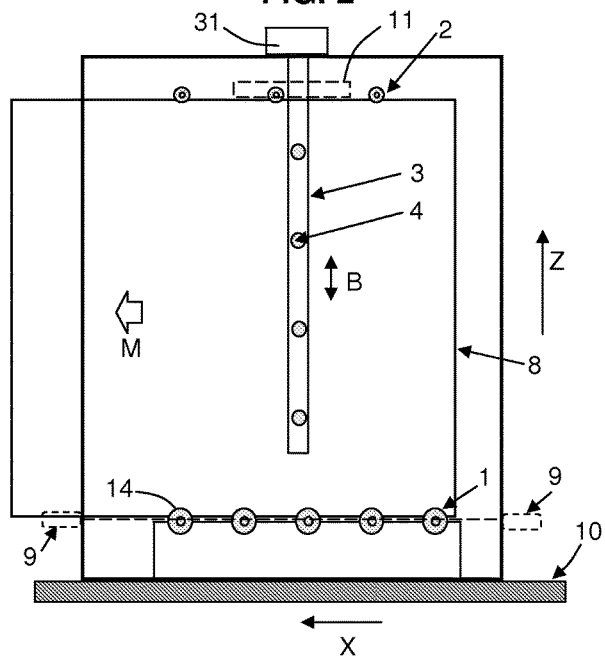
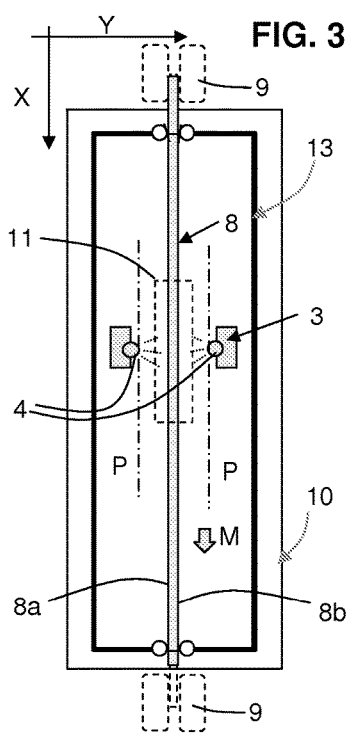
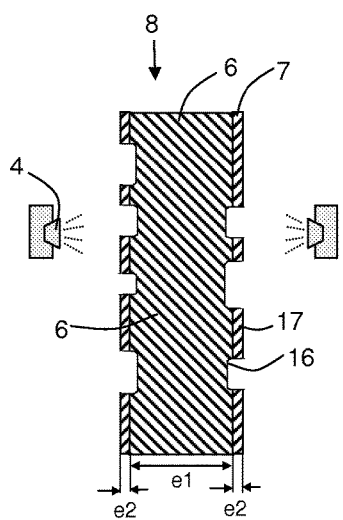

MACHINE TO CHEMICALLY ENGRAVE A PLATE OF STAINLESS STEEL

FIELD OF THE INVENTION

The present invention relates to machines and methods to chemically engrave a plate of stainless steel. Such a plate of stainless steel can be used to manufacture laminate assemblies and it may be advantageous to provide the surface of said stainless steel plate with a predetermined surface pattern.

BACKGROUND OF THE INVENTION

It is known, for example from document US2010/006542, to obtain a surface pattern thanks to a chemical attack of the stainless steel, said attack being optionally rendered selective thanks to a protection mask.

In the prior art, a stainless steel plate, placed horizontally, is made to be moved in front of acid liquid spraying nozzles, located below and above said plate, in order to simultaneously engrave both sides of the plate.

However, on the side facing upwards, the presence of previously sprayed liquid is detrimental to the quality and reliability of the chemical engraving.

SUMMARY OF THE INVENTION

The present invention is intended to improve prior machines and methods to chemically engrave a plate of stainless steel.

To this end, the invention proposes a chemical engraving machine to engrave a plate of stainless steel configured to be moved along a first direction, said machine comprising:
 a base,
 a housing,
 an acid liquid circuit adapted to chemically attack said plate of stainless steel at locations where it is not protected by a protection mask,
 a lower guiding device borne by said base,
 an upper guiding device, located above and substantially vertically with regard to the lower guiding device,
 the lower and upper guiding devices being configured to maintain said plate of stainless steel substantially vertically,
 at least a nozzle support bearing a plurality of spraying nozzles configured to project the acid liquid toward the plate of stainless steel substantially horizontally.

Thanks to these dispositions, the previously sprayed liquid is quickly evacuated by gravity on both sides of the plate and the simultaneous engraving of both sides is better controlled and proves to be particularly advantageous.

In various embodiments of the invention, one and/or the other of the following features may be incorporated.

According to one aspect, the nozzle support may be configured to be moved according to an alternate movement, said movement being substantially parallel to a plane defined by the first direction and the vertical direction. Therefore, the quantity of acid liquid sprayed in the plate can be uniform across the surface of the plate, thereby ensuring a good quality of engraving.

According to another aspect, the machine may comprise a driving system to drive the stainless steel plate along the first direction at a predetermined speed. The uniformity of spraying can be respected all along the plate surface.

According to another aspect, the acid liquid may comprise mainly ferric chloride; which is a particularly relevant liquid to attack the stainless steel.

According to another aspect, the machine may comprise a pressure control system, wherein the spraying pressure is selectively adjusted according to the vertical position of nozzles. Thereby the effects of differential static pressure according to vertical position can be compensated for.

According to another aspect, the machine may comprise nozzles on both sides of the stainless steel plate. Thus, both faces of the plate can be engraved in a single process step.

According to another aspect, the at least one nozzle support is pivotable. Thereby, the tuning of the quality of the engraving process may be more flexible.

According to another aspect, the machine may comprise a pre-wetting station, and/or a rinsing station and and/or a drying station.

According to another aspect, the machine may comprise a waterfall of acid liquid poured on the top of the stainless steel plate complementing the spraying nozzles. This enhances the chemical engraving process.

According to another aspect, the machine may comprise a liquid temperature control system. This enhances the quality of the engraving process.

The invention is also directed to a method to chemically engrave a plate of stainless steel comprising the steps:
 provide a plate of stainless steel partially protected by a protection mask,
 place said plate of stainless steel substantially vertically,
 impart to the plate a movement to displace the plate along a first horizontal direction,
 spray liquid on said plate of stainless steel thanks to nozzles, the main direction of spraying being substantially horizontal and perpendicular to the first horizontal direction.

Thanks to these dispositions, the previously sprayed liquid is quickly evacuated by gravity on both sides of the plate and the simultaneous engraving of both sides is better controlled and the method proves to be particularly advantageous.

According to another aspect, the nozzles may be borne by at least a nozzle support configured be moved according to an alternate movement, said movement being substantially parallel to a plane defined by the first direction and the vertical direction. Therefore, the quantity of acid liquid sprayed in the plate can be uniform across the surface of the plate, thereby ensuring a good quality of engraving.

According to another aspect, both faces of the stainless plate may be simultaneously sprayed. Thus, both faces of the plate can be engraved in a single process step.

According to another aspect, it may be provided a waterfall of acid liquid poured on the top of the stainless plate. This enhances the chemical engraving process.

According to another aspect, the method may comprise a step of controlling the spraying pressure selectively according to the vertical position of nozzles. Thereby the effects of differential static pressure according to vertical position can be compensated for.

According to another aspect, the method may comprise a preliminary step of pre-wetting the stainless plate. This may further enhance the engraving process.

According to another aspect, the method may comprise one of the following subsequent steps of rinsing the plate and/or drying the plate. This may facilitate and accelerate subsequent processing.

BRIEF DESCRIPTION OF THE DRAWINGS

Other features and advantages of the invention appear from the following detailed description of one of its embodiments, given by way of non-limiting example, and with reference to the accompanying drawings.

In the drawings:

FIG. 1 is a schematic front view of the engraving machine according to the invention, FIG. 2 is a schematic side view of the machine of FIG. 1, FIG. 3 is a schematic top view of the machine of FIG. 1, FIG. 4 is a sectional view of a plate of stainless steel processed in the machine of FIG. 1.

MORE DETAILED DESCRIPTION OF THE INVENTION

Figure 5:
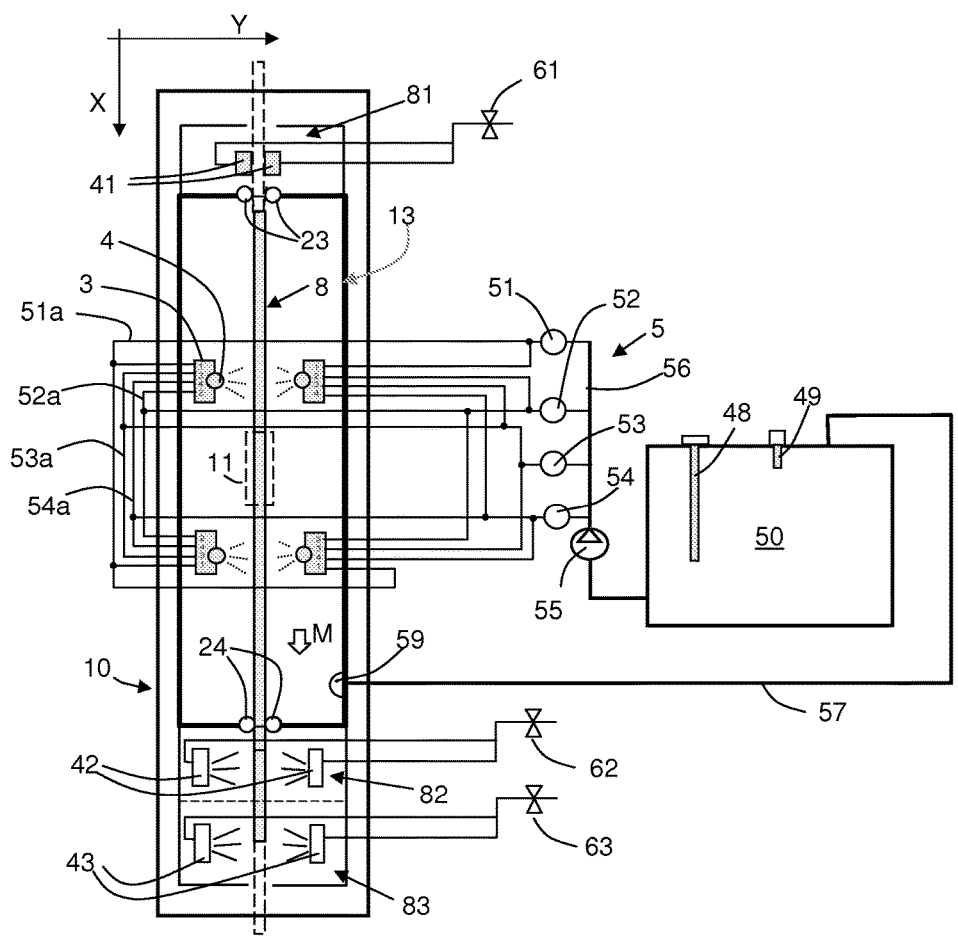
FIG. 5 is a diagrammatical view of various fluid circuits and additional features arranged with a variant of the machine of FIG. 1.

In the figures, the same references denote identical or similar elements.

FIGS. 1-3 show a machine to process a plate of a metallic stainless steel 8, and particularly the concerned process here is a chemical process, i.e. a process in which a chemical product chemically attacks the surface of said stainless steel plate 8. Said chemical attack is known as 'engraving' or 'etching' in the art. Also, the plate of a stainless steel may be known in the art as a sheet of a stainless steel.

In the figures, the direction Z denotes the vertical direction, the direction X denotes a horizontal direction extending along the longitudinal direction of the machine and the direction Y denotes a horizontal direction extending along the transversal direction of the machine.

In the illustrated example, the machine comprises:
a base 10, which serves as a support and is placed on the ground,
a housing 13, which serves as an enclosure to delimit an interior space from the exterior environment,
a lower guiding device 1 borne by said base 10, disposed in the lower area in the interior space of the machine,
an upper guiding device 2, located above and substantially vertically with regard to the lower guiding device.

As illustrated, the lower and upper guiding devices 1,2 are configured to maintain a plate of stainless steel 8 substantially vertically.

The plate of stainless steel 8 has a thickness comprised between 1 mm and 10 mm, preferably between 2 mm and 5 mm. The other dimensions of the plate may reach 3 m or more.

The plate of stainless steel 8 comprises, as shown in FIG. 4, a centre core 6 made of stainless steel and at least a thin protective layer 7. In the depicted example, there are provided one thin protective layer 7 on each side of the centre core 6. This protective layer may for example comprise a resin which does not interact with the acid liquid. Therefore, the thin protective layers 7 constitute a protective mask 7 such that the stainless steel is not attacked at locations 17 where this protective mask 7 covers the surface of the stainless steel. At locations 16 where this protective mask is not present, the acid liquid etches a thin layer of stainless steel. The centre core 6 exhibits a thickness 'e1' much greater than the thickness 'e2' of the protective layers 7.

The lower guiding device 1 may comprise rollers 14 on which bears vertically the plate 8 and adjustable lateral guiding surfaces which maintain the plate 8 along the transversal direction Y. Similarly, the upper guiding device 2 comprises adjustable lateral guiding surfaces which also maintain the plate 8 along the transversal direction Y. The upper guiding device 2 may also comprise optionally upper rollers. Upper and lower adjustable lateral guiding surfaces are configured so that the machine can accept plates of different thicknesses.

The machine may further comprise a driving system 9 to drive the stainless steel plate 8 along the first direction horizontal X at a predetermined speed (this movement is denoted 'M' in the figures). In the depicted example, the driving system 9 is preferably located outside of the housing 13 so as to be protected again acid liquid attacks.

The driving system 9 may comprise one or more looped driving chain. However, any other solution to impart a movement along the first direction horizontal X may be chosen, not excluding manual or semi-manual means.

Further, the machine comprises at least a nozzle support 3 bearing a plurality of spraying nozzles 4 configured to project the acid liquid toward the plate of stainless steel 8 substantially horizontally.

As illustrated there are preferably provided spraying nozzles 4 on both sides of the plate 8, thereby spraying occurs simultaneously on both faces 8a,8b of the plate.

In the shown example, there are provided four spraying nozzles 4 on each support 3. The spraying nozzles 4 are spaced vertically from one another.

Preferably according to the present invention, the nozzle support 3 is configured to be moved according to an alternate movement (denoted 'B'), said movement being substantially parallel to a plane P defined by the first direction X and the vertical direction Z.

This movement may be a to-and-fro movement along the vertical direction. The movement may also be an elliptical movement, for example exhibiting a vertical main axis.

Moreover, each of the nozzle support 3 may be pivotable according to the vertical axis Z. This is made possible thanks to an adjustment mechanism 31 located in the illustrated example at the top of the nozzle support 3. This adjustment mechanism 31 may be controlled by a manual operation or by a powered actuator like for example a stepper motor.

Further, in reference to FIG. 5, the illustrated machine comprises an acid liquid circuit 5. The acid liquid comprises mainly ferric chloride, this compound is adapted to chemically attack the surface of the plate of stainless steel at locations 16 where it is not protected by a protection mask 7.

The acid liquid circuit 5 is a closed loop circuit and typically comprises:
a reservoir 50,
a pump 55,
a distribution duct 56,
distribution manifolds 51a-54a having a pressure control system 51-54 which will be detailed later,
a collector 59 at the bottom of the enclosure 13,
a return pipe 57.

The pump 55 is fed by the reservoir and provides pressure toward spraying nozzles. The collector 59 gathers the liquid pouring from the spraying, and the return pipe 57, fitted with an auxiliary pump if necessary, returns the liquid to the reservoir.

In the depicted example of FIG. 5, there are provided four nozzle supports 3, each of them bearing four spraying nozzles 4.

At each group of spraying nozzles borne by a support 3, there are provided supply pipes in fluid connection with pressure regulating devices.

For example, referring to FIG. 5, a first pressure regulating device 51 supplies a first distribution system 51a having pipes connected to each nozzle at the same vertical position.

More precisely, such first group of four spraying nozzles at one particular vertical position are supported by different nozzle supports 3 but are supplied by a single pressure regulating device 51 at a predefined pressure.

Similarly, a second pressure regulating device 52 supplies a group of four other spraying nozzles 4 at another vertical position are supported by different nozzle supports 3 but are supplied through another distribution pipe system 52a by a single pressure regulating device 52 at another predefined pressure.

Similarly, a third pressure regulating device 53 supplies a group of four further spraying nozzles 4 at a further vertical position are supplied through a further distribution pipe system 53a by a single pressure regulating device 53 at still another predefined pressure.

Finally, in the depicted example, a fourth pressure regulating device 54 supplies a group of four further spraying nozzles 4 at a further vertical position are supplied through a further distribution pipe system 54a by a single pressure regulating device 54 at still another predefined pressure.

According to an aspect of the invention, the pressure regulating devices 51-54 have regulated output in relation with the vertical position of their corresponding spraying nozzles such that the spraying pressure is selectively adjusted according to the vertical position of nozzles, thereby ensuring a homogeneous and uniform spraying effectiveness. The setpoints of these pressure regulating devices 51-54 may depend on the physical locations of these pressure regulating devices 51-54. Said setpoints may be controlled manually or by a controller (not shown).

Advantageously, the acid liquid circuit 5 comprises a liquid temperature control system 48,49. A heating device 48, controlled by a temperature controller (not shown), supplies heat in the liquid to maintain the reservoir at a stable temperature. A temperature sensing device 49 transmits the sensed temperature in the reservoir to the temperature controller. Preferably, the temperature is regulated to a value around 45° C.

Advantageously, the acid liquid circuit 5 optionally comprises a waterfall 11 of acid liquid poured on the top of the stainless steel plate complementing the spraying nozzles. The waterfall 11 of acid liquid may precede the spraying in the direction of displacement. However, such waterfall 11 of acid liquid may follow the spraying and thus placed downstream of the spraying nozzles. In the shown example of FIG. 1, such waterfall 11 extends along a certain length and both precedes and follows the spraying nozzles locations.

Further, the machine optionally comprises a pre-wetting station 81 having a pre-wetting circuit 61, and pre-wetting nozzles 41 supplying water and/or a wetting agent to wet the plate.

Further, the machine optionally comprises a rinsing station 82 having a rinsing circuit 62, and rinsing nozzles 42 supplying water to rinse the plate.

Further, the machine optionally comprises a drying station 83 having a drying circuit 63 and drying nozzles 43 supplying air to dry the plate.

It is to be noted that the housing is closed at the plate entrance location and plate exit location.

Figure 6:
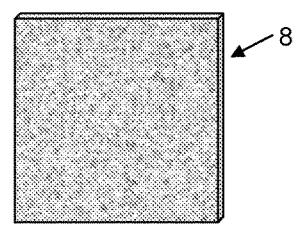
FIG. 6 is a perspective view of a plate of stainless steel processed in the machine of FIG. 1.

FIG. 6 shows the resulting plate 8 where the pattern of attacked areas gives a valuable macroscopic effect. Such a plate of stainless steel can be used as a matrix to manufacture various laminate assemblies by hot pressing. Resulting laminate assemblies exhibit a corresponding surface therefrom (negative of the plate pattern).

According to an additional feature, the upper guiding device 2 may be adjustable in height, so that the machine can accept different size of plates, in particular different height.

The enclosure may comprise separation means, in particular an entrance separation means 23, for example flexible vertical rollers, and exit separation means 24.

The invention claimed is:

1. An assembly comprising:
    a plate of stainless steel having a thickness comprised between 2 mm and 5 mm; and
    a chemical engraving machine to engrave the plate of stainless steel configured to be moved along a first direction, said machine comprising:
    a base,
    a housing,
    an acid liquid circuit adapted to chemically attack said plate of stainless steel with an acid liquid at locations where the plate is not protected by a protection mask placed on a surface of the plate,
    a lower guiding device borne by said base, the lower guiding device comprising rollers with horizontal axes to support the weight of the plate,
    an upper guiding device located above and substantially vertically with regard to the lower guiding device, the lower and upper guiding devices being configured to maintain said plate of stainless steel substantially vertically, and
    at least a nozzle support bearing a plurality of spraying nozzles configured to project the acid liquid toward the plate of stainless steel substantially horizontally and chemically attack a thin layer of the surface without perforating the plate, wherein the nozzle support is configured to be moved according to to-and-fro movement in the vertical direction.

2. The assembly according to claim 1, comprising a driving system configured to drive the stainless steel plate along the first direction at a predetermined speed.

3. The assembly according to claim 1, wherein the acid liquid comprises mainly ferric chloride.

4. The assembly according to claim 1, comprising a pressure control system configured to selectively adjust a spraying pressure according to the vertical position of nozzles.

5. The assembly according to claim 1, comprising nozzles on both sides of the stainless steel plate.

6. The assembly according to claim 1, wherein the at least one nozzle support is pivotable around a vertical axis.

7. The assembly according to claim 1, comprising at least one of a pre-wetting station, a rinsing station, and a drying station.

8. The assembly according to claim 1, comprising a waterfall of acid liquid poured on the top of the stainless steel plate, the waterfall preceding at least some of the nozzles with respect to the first direction.

9. The assembly according to claim 1, comprising a liquid temperature control system.

10. The assembly according to claim 1, wherein the thin layer has a depth less than 1/10 of the thickness of the steel plate.

\* \* \* \* \*